(12) United States Patent
Fukushima et al.

(10) Patent No.: US 6,344,309 B2
(45) Date of Patent: *Feb. 5, 2002

(54) POLYSILANE COMPOSITION FOR FORMING A COATING SUITABLE FOR BEARING A METAL PATTERN, METAL PATTERN FORMING METHOD, WIRING BOARD PREPARING METHOD

(75) Inventors: Motoo Fukushima; Kunio Ito; Shigeru Mori, all of Gunma-ken (JP)

(73) Assignee: Shin-Etsu Chemical Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/422,731

(22) Filed: Oct. 22, 1999

(30) Foreign Application Priority Data

Oct. 22, 1998 (JP) ............................................ 10-300894
Oct. 30, 1998 (JP) ............................................ 10-309793

(51) Int. Cl.$^7$ ................................................ C25D 5/54
(52) U.S. Cl. ...................... 430/324; 430/322; 430/297; 528/34; 528/38; 427/98; 205/163; 205/167
(58) Field of Search ...................... 528/34, 38; 205/163, 205/167; 427/98; 430/322, 324, 297

(56) References Cited

U.S. PATENT DOCUMENTS

| 4,602,050 | A | * | 7/1986 | West et al. .................. 522/135 |
| 4,952,658 | A | * | 8/1990 | Kalchauer et al. ............ 528/34 |
| 5,858,541 | A | * | 1/1999 | Hiraoka et al. ............. 428/429 |
| 5,955,192 | A | * | 9/1999 | Fukushima et al. ......... 428/345 |
| 6,110,651 | A | * | 8/2000 | Fukushima et al. ......... 430/322 |

OTHER PUBLICATIONS

Abstract, JP 10326957, Dec. 1998.*
Abstract, JP 10268521, Oct. 1998.*

* cited by examiner

*Primary Examiner*—Margaret G. Moore

(57) ABSTRACT

A metal pattern is prepared by applying a polysilane composition comprising a polysilane, a carbon functional silane, and a solvent onto a substrate to form a patterned coating of the polysilane composition, attaching catalytic metal nuclei to the patterned coating, and immersing the substrate in an electroless plating bath for thereby chemically depositing a metal film on the patterned coating.

6 Claims, 2 Drawing Sheets

STEP (1)

STEP (2)

STEP (3)

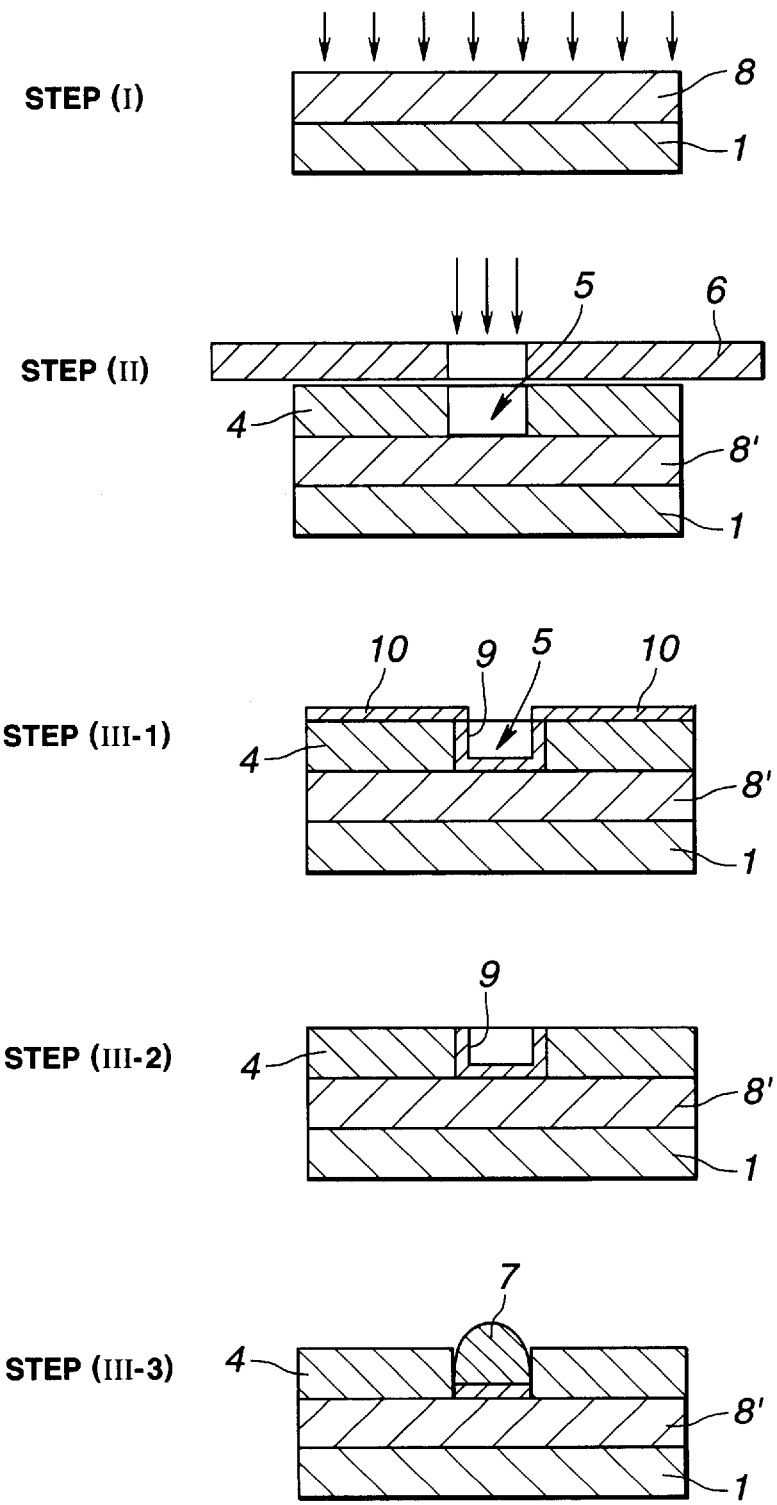

POLYSILANE COMPOSITION FOR FORMING A COATING SUITABLE FOR BEARING A METAL PATTERN, METAL PATTERN FORMING METHOD, WIRING BOARD PREPARING METHOD

This invention relates to a polysilane composition for forming a coating suitable for bearing a metal pattern, and a metal pattern forming method using the same. It also relates to a method for preparing a wiring board.

BACKGROUND OF THE INVENTION

Substrates having metal patterns formed thereon are used in a variety of applications, for example, as printed circuit boards and comb-shaped electrode substrates for sensors. Metallization on such substrates is generally carried out by vapor phase methods such as CVD and wet methods as typified by plating methods. The metal is then patterned by a complex method which generally uses a resist material and involves exposure and development steps.

To eliminate such complication, Whiteside et al. proposed a novel metal patterning procedure. This procedure is to form a metal pattern by immersing a rubber material having an irregular surface in a dispersion of palladium colloid. The rubber material is then pressed against a substrate whereby the palladium colloid on raised portions is transferred to the substrate. The substrate is then immersed in an electroless or chemical plating bath whereby a metal deposits only on the palladium colloid- bearing areas. (See Langmuir 1996, 12, 1375–1380.)

Unfortunately, this procedure has the drawback that the palladium colloid is very unstable. Typically, a surfactant such as tetraammonium halide is added to the palladium colloid for stabilizing the colloid. An attempt to apply the palladium colloid by an imprinting, ink jet printing or lithographic process fails because of coagulation and precipitation of the palladium colloid. No uniform metal pattern is formed and the adhesion between the substrate and the metal is insufficient.

Printed circuit boards now encounter a strong need for higher density because of the widespread use of ultra-thin equipment. In prior art printed circuit boards, after a copper foil is bonded to a resin substrate with an adhesive, patterning is carried out using a resist (subtractive process). However, a proper adhesive must be used depending on a particular resin selected from among phenolic resins, polyester resins, epoxy resins, polyimide resins, and bismaleimide triazine resins. A complex bonding process is necessary. The bond strength is not fully high.

In recent years, a need to form a finer metal pattern promotes research efforts on the additive process of metallizing a resin substrate, rather than the subtractive process suffering from the thinning of a metal film by over-etching, so that the additive process may be employed on a commercially acceptable level. For the additive process, however, an improvement in the adhesion between the resin substrate and the metallization is of significance.

For logic devices and system LSI's, there is a strong need to increase the degree of integration and operational speed of circuits in order to realize high-speed electronic equipment. In this regard, an attention is paid to copper as a low resistance wiring material. In the prior art semiconductor device manufacture, aluminum is used as the material for forming fine metal circuits on semiconductor and a CVD process is used for its application. Copper is more difficult to work than aluminum. Then there is an urgent desire to establish a micro-wiring technique for copper. One solution to the above-described problem is electrolytic plating. It has been studied to apply electrolytic plating to the copper wiring process on a commercially acceptable level (see monthly Semiconductor World, February 1998, pp. 82–85).

However, the electrolytic plating has the drawback that the thickness of metal coating locally varies and is not reproducible, which becomes a neck to mass manufacture. When the electrolytic plating is combined with a resist material and resist process necessary to form a fine metal pattern in a mass scale, optimum conditions of the electrolytic plating have not been fully established.

Polysilane is an interesting polymer because of its UV absorption properties due to the metallic property and unique electron delocalization of silicon as compared with carbon, as well as its high heat resistance, flexibility, and good thin film forming properties. Active research efforts have been made on polysilane for the purpose of developing a photoresist capable of forming a micropattern at a high precision (see, for example, JP-A 6-291273 and 7-114188).

Finding that a palladium colloid forms when a polysilane is contacted with a solution of a palladium salt, and that UV irradiation causes the conversion of polysilane into polysiloxane, the inventors proposed a pattern forming method. The inventors also found that a metal pattern can be formed by combining such characteristics of a polysilane thin film with electroless plating catalyzed by palladium colloid (JP-A 10-325957). However, this method still requires the steps of light irradiation and exposure.

JP-A 5-72694 discloses the use of a polysilane in a method for preparing a semiconductor integrated circuit. This method is characterized in that a film of polysilane optionally doped with iodine is used as a conductive layer and a siloxane layer converted from polysilane by light irradiation is used as an insulating layer. It has thus been contemplated to apply the polysilane or polymer having a Si-to-Si bond as conductive material.

However, the semiconductor integrated circuit obtained by the above method has the problems that the conductive areas consisting solely of polysilane are not fully conductive and the use of potentially corrosive iodine becomes a serious obstacle to the application of polysilane to electronic material. Additionally, since the polysilane which is likely to convert into siloxane upon exposure to moisture, oxygen or light in the ambient atmosphere is used as conductive material, its application to electronic material requiring reliability encounters great difficulty.

JP-A 57-11339 discloses a method for forming a metal image by exposing a compound having a Si-to-Si bond to light and contacting it with a metal salt solution. When the compound having a Si-to-Si bond is contacted with the metal salt solution, the metal salt is reduced to the metal. Utilizing this phenomenon, a metal layer is formed in the unexposed area. To define a definite image by this method, the exposed area must be completely deprived of reducing property, which requires to irradiate a large quantity of light. Upon light exposure, the polysilane is converted into siloxane. Once a finely defined circuit is formed by UV irradiation, it becomes very difficult to further convert the siloxane into a polycarbosilane or polysilazane which is an insulating ceramic precursor having heat resistance and toughness.

There is a desire to have a technique of manufacturing a wiring board of high quality in an industrially advantageous manner.

SUMMARY OF THE INVENTION

One object of the invention is to provide a method of forming a metal pattern on a substrate by a simple step such as a conventionally employed imprinting, ink jet printing or lithographic process without a need for light irradiation and exposure. Another object is to provide a polysilane composition used in the method for forming a coating suitable for bearing a metal pattern.

A further object is to provide a method for preparing a wiring board having a pattern of highly conductive areas and insulating areas through simple and inexpensive steps so that the wiring board may have high heat resistance and pattern definition and be used in a variety of applications in the electric, electronic and communication fields.

In a first embodiment of the invention, there is provided a polysilane composition for forming a coating suitable for bearing a metal pattern thereon, comprising a polysilane, a carbon functional silane, and a solvent.

In a second embodiment of the invention, there is provided a metal pattern forming method comprising the steps of:

applying the above-defined polysilane composition onto a substrate by an imprinting, ink jet printing or lithographic process, to form a patterned coating of the polysilane composition, attaching catalytic metal nuclei for electroless plating to the patterned coating, and immersing the substrate in an electroless plating bath and depositing an electroless plating film on the patterned coating.

The inventors have found that a composition comprising a polysilane and a carbon functional silane (sometimes abbreviated as CF silane) forms a coating which readily captures a palladium salt and thus ensures that an electroless plating film forms thereon with a firm bond. The coating itself has a high strength. Using the polysilane composition, a patterned film of polysilane can be easily formed on a substrate by an imprinting, ink jet printing or lithographic process. After catalytic metal nuclei such as palladium nuclei are distributed on the patterned coating, the substrate is immersed in an electroless plating bath. In this way, a metal pattern can be formed by a simple inexpensive process without a need for exposure and development steps.

In a third embodiment of the invention, there is provided a method for preparing a wiring board comprising the steps of:

(1) forming a carbon functional silane-containing polysilane thin film on a substrate and contacting a palladium salt with a surface of the polysilane thin film to form a palladium colloid layer thereon, (2) forming a photosensitive resin layer on the polysilane thin film having the palladium colloid layer, selectively irradiating light to the layer, and developing the layer, to thereby form a predetermined pattern of channels in the photosensitive resin layer so that the polysilane thin film having the palladium colloid layer is exposed within the channels, and (3) contacting an electroless plating solution with the polysilane thin film having the palladium colloid layer exposed within the channels, for thereby forming a conductive metal layer within the channels.

In a fourth embodiment of the invention, there is provided a method for preparing a wiring board comprising the steps of:

(I) forming a SiH group-containing polysilane thin film on a substrate and irradiating light to the thin film for crosslinking the polysilane for thereby insolubilizing the polysilane, (II) forming a photosensitive resin layer on the crosslinked polysilane thin film, selectively irradiating light to the layer, and developing the layer, to thereby form a predetermined pattern of channels in the photosensitive resin layer so that the crosslinked polysilane thin film is exposed within the channels, and (III) contacting a palladium salt with the crosslinked polysilane thin film exposed within the channels to form a palladium colloid layer and contacting an electroless plating solution for thereby forming a conductive metal layer within the channels.

The inventors found that when a polysilane is previously irradiated with UV radiation, the polysilane is converted into a polysiloxane so that the surface is changed to be polar. When this polysiloxane is contacted with a palladium salt solution, a palladium colloid can be formed, which enables pattern formation. As long as the palladium colloid is attached to the surface of a resin coating, the electroless plating method permits a metal film of uniform thickness to form on a variety of resins. A metal pattern of copper can be formed by combining the above-described characteristics of a polysilane thin film with electroless plating catalyzed by palladium colloid. A circuit board having improved heat resistance and pattern definition can be manufactured by a simple inexpensive process. This process is proposed in Japanese Patent Application No. 10-94111.

Continuing the research, the inventors found that in a method for preparing a circuit board utilizing a metal pattern, the metal pattern sometimes has an unsatisfactory adhesion to the substrate. When the metal pattern is formed utilizing the optically defined resist pattern, the metal area partially spreads with the progress of metal deposition. Then, the pattern resulting from the resist becomes far from satisfactory.

Then the inventors made further research to produce a wiring board which has improved adhesion between a metal pattern and a substrate and an improved pattern profile. In the wiring board preparing method according to the third embodiment of the invention, a composition comprising a polysilane and a CF silane as main components is applied onto a substrate to form a CF-silane containing polysilane thin film having an improved film strength. When the polysilane thin film is contacted with a palladium salt, the palladium salt is readily captured by the polysilane thin film to form a palladium colloid layer thereon. Then a photosensitive resin layer is formed on the palladium colloid layer for forming a pattern of channels. The CF-silane containing polysilane thin film is exposed within the channels. Then electroless plating is carried out. The adhesion between the conductive metal layer of copper or the like formed by the electroless plating and the substrate is strong. Since the conductive metal layer is formed within the channels, there is no risk that the conductive metal area spreads out.

In the wiring board preparing method according to the fourth embodiment of the invention, a polysilane undergoes crosslinking reaction under irradiation of light such as ultraviolet radiation and becomes insoluble in solvents. Even after being crosslinked by light irradiation, this polymer is effective for readily reducing a palladium salt in contact therewith, to form a palladium colloid. A photosensitive resin layer is then formed on the crosslinked polysilane thin film to define a predetermined pattern of channels so that the crosslinked polysilane thin film is exposed within the channels. After a palladium colloid layer is formed thereat, electroless plating is carried out to form a conductive metal layer as in the third embodiment. In this way, there can be formed a metal pattern which has improved adhesion to the substrate, and is stable and free of the risk that the conductive metal area spreads out. A conductive wiring pattern having satisfactory definition can be manufactured by a simple inexpensive process.

The wiring board preparing method of the invention can fabricate, through simple and inexpensive steps, a wiring board which has high heat resistance and a high degree of pattern definition and can be used in a variety of applications in the electric, electronic and communication fields.

BRIEF DESCRIPTION OF THE DRAWINGS

FIG. 2 schematically illustrates a wiring board preparing method according to the fourth embodiment of the invention.

DESCRIPTION OF THE PREFERRED EMBODIMENTS

Figure 1:
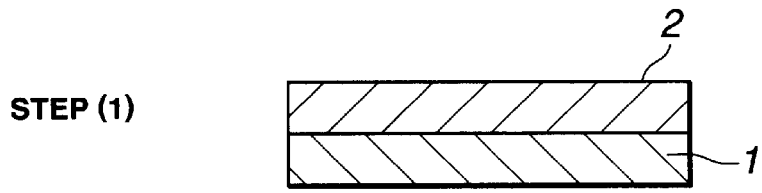
FIG. 1 schematically illustrates a wiring board preparing method according to the third embodiment of the invention.
Figure 1:
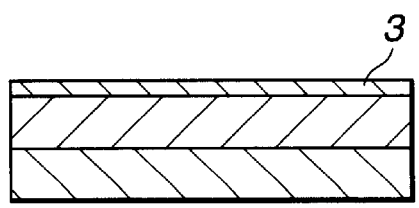
Figure 1:
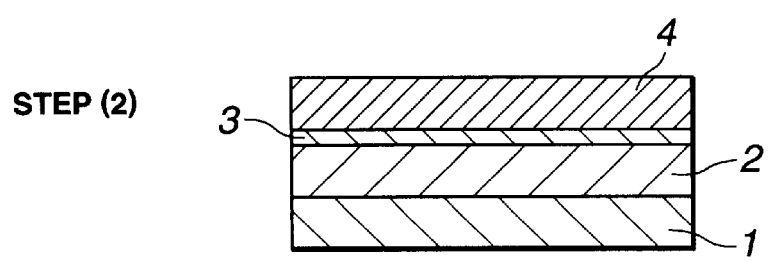
Figure 1:
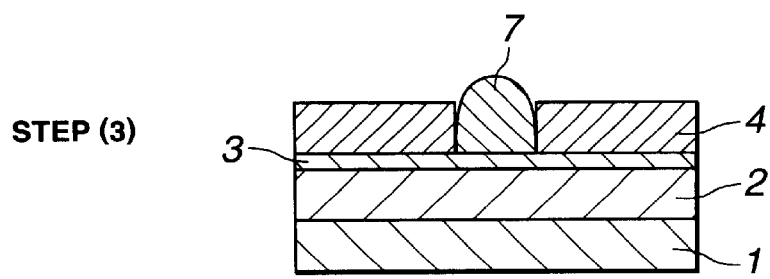

The polysilane composition according to the invention is defined as comprising a polysilane, a carbon functional silane (CF silane), and a solvent in which these components are dissolved. The composition is effective for forming a coating suitable for bearing a metal pattern thereon.

The polysilane used herein may be of any type as long as it can form a coating. Preferably, the polysilane is of the following formula (1):

wherein $R^1$ and $R^2$ each are hydrogen or a substituted or unsubstituted monovalent hydrocarbon group, X is hydrogen or a substituted or unsubstituted monovalent hydrocarbon group, alkoxy group or halogen atom, m is a number of 0.1 to 2, n is a number of 0 to 1, p is a number of 0 to 0.5, the sum of m+n+p is from 1 to 2.5, and q is an integer of 4 to 100,000.

The monovalent hydrocarbon groups represented by $R^1$ and $R^2$ include substituted or unsubstituted aliphatic, alicyclic and aromatic hydrocarbon groups. Preferred aliphatic and alicyclic hydrocarbon groups are those of 1 to 12 carbon atoms, especially 1 to 8 carbon atoms, for example, but not limited to, alkyl and cycloalkyl groups such as methyl, ethyl, propyl, butyl, pentyl, hexyl, cyclopentyl and cyclohexyl. Preferred aromatic hydrocarbon groups are those of 6 to 14 carbon atoms, especially 6 to 10 carbon atoms, for example, but not limited to, aryl groups such as phenyl, tolyl, xylyl and naphthyl and aralkyl groups such as phenylethyl. The substituted hydrocarbon groups are the above-described unsubstituted aliphatic, alicyclic and aromatic hydrocarbon groups in which some or all of the hydrogen atoms are replaced by halogen atoms, alkoxy groups, amino groups, aminoalkyl groups and other substituents, for example, but not limited to, monofluoromethyl, trifluoromethyl, p-dimethylaminophenyl, and m-dimethylaminophenyl.

X represents groups as defined for $R^1$ or alkoxy groups or halogen atoms. Exemplary alkoxy groups are those of 1 to 4 carbon atoms, such as methoxy and ethoxy. Preferred halogen atoms are fluorine, chlorine and bromine. Of these, chlorine atoms, methoxy and ethoxy groups are preferable. It is noted that the group represented by X is effective for preventing the polysilane coating from separating from the substrate and thus improving the adhesion of the coating to the substrate.

The letters m, n and p are numbers satisfying $0.1 \leq m \leq 2$, preferably $0.5 \leq m \leq 2$, $0 \leq n \leq 1$, preferably $0.5 \leq n \leq 1$, $0 \leq p \leq 0.5$, preferably $0 \leq p \leq 0.2$, and $1 \leq m+n+p \leq 2.5$, preferably $1.5 \leq m+n+p \leq 2.5$. The letter q is an integer of $4 \leq q \leq 100,000$, preferably $10 \leq q \leq 10,000$.

The polysilane of formula (1) can be readily synthesized, for example, by adding an alkali metal catalyst (e.g., metallic sodium) to an organic solvent (e.g., toluene) in a nitrogen stream, and agitating the mixture at a high speed while heating, thereby effecting dispersion. To the dispersion, a silicon compound (e.g., dichloroorganosilane) is slowly added dropwise in an amount of about 1 mol of the silicon compound relative to 2 or 3 mol of metallic sodium. The reaction solution is agitated for 1 to 8 hours until the silicon compound disappears. After the completion of reaction, the reaction solution is allowed to cool down, filtered to remove the salt, and concentrated.

The CF silane is preferably of the following general formula (3):

wherein Y is a functional group such as a vinyl, epoxy, amino, mercapto, methacryloxy or acryloxy functional group, R is a substituted or unsubstituted monovalent hydrocarbon group, b is an integer of 0 to 3, and a is equal to 0 or 1.

R represents monovalent hydrocarbon group as defined above for $R^1$ and $R^2$, preferably alkyl groups of 1 to 5 carbon atoms. An exemplary vinyl functional group is $CH_2=CH-$, exemplary epoxy functional groups are γ-glycidoxy and 3,4-epoxycyclohexyl, exemplary amino functional groups are $NH_2-$ and $NH_2CH_2CH_2NH-$, an exemplary mercapto functional group is mercapto, exemplary methacryloxy and acryloxy functional groups are methacryloxy and acryloxy.

Illustrative examples of the CF silane of formula (3) include vinyltrimethoxysilane (KBM-1003), vinyltriethoxysilane (KBE-1003), β-(3,4-epoxycyclohexyl)-ethyltrimethoxysilane (KBM-303), γ-glycidoxypropyl-trimethoxysilane (KBM-403), N-β-(aminoethyl)-γ-aminopropylmethyldimethoxysilane (KBM-602), N-β-(aminoethyl)-γ-aminopropyltrimethoxysilane (KBM-603), γ-aminopropyltrimethoxysilane (KBM-903), and γ-aminopropyltriethoxysilane (KBE-903), all commercially available under the indicated trade name from Shin-Etsu Chemical Co., Ltd. Of these, amino group-containing CF silanes: KBM-602, KBM-603, KBM-902, KBM-903, KBE-602, KBE-603, KBE-902 and KBE-903 are preferable.

An appropriate amount of the CF silane added is 0.01 to 200 parts, especially 0.1 to 10 parts by weight per 100 parts by weight of the polysilane. Outside the range, a less amount of the CF silane would fail to achieve sufficient adhesion whereas an excessive amount of the CF silane would sometimes adversely affect film formation and rather lower the adhesion.

The addition of the CF silane improves the strength of a polysilane coating and permits the polysilane coating to readily capture a palladium salt when the palladium salt is brought into contact therewith, which in turn, enables that a metal film (e.g., of copper) having improved adhesion to the substrate is formed by electroless plating.

The polysilane and the CF silane are dissolved in a suitable organic solvent. Examples of the solvent used herein include aromatic hydrocarbon solvents such as benzene, toluene and xylene, ether solvents such as tetrahydrofuran and dibutyl ether, alcohol solvents such as methanol and ethanol, alkoxyethanol solvents such as ethyl cellosolve and methyl cellosolve, ketone solvents such as acetone and methyl ethyl ketone, ester solvents such as ethyl acetate, butyl acetate, methyl lactate, and ethyl lactate, and ether ester solvents such as PGMEA. An appropriate amount of the solvent used is about 10 to about 10,000 parts by weight per 100 parts by weight of the silicon components (polysilane and CF silane) combined.

To the composition, inorganic powders such as fumed silica and alkoxysilanes such as tetraethoxysilane may be added if necessary.

The metal pattern forming method according to the second embodiment of the invention uses the above-defined polysilane composition and involves the steps of:

(1) forming a polysilane pattern on a substrate by an imprinting, ink jet printing or lithographic process, and (2) immersing the substrate in a solution of a catalytic metal salt such as a palladium salt and then in an electroless plating bath for depositing a metal on the pattern.

If desired, the substrate resulting from step (1) and/or (2) is subjected to UV irradiation or heating for improving the adhesion between the metal and the substrate. There is obtained a substrate having a metal pattern formed thereon and firmly adhered thereto.

The substrate used herein may be made of insulating materials such as glass, ceramics and plastics, semiconductors such as silicon, and conductors such as copper. Among these, resins or plastics such as phenolic resins, polyester resins, epoxy resins, polyimide resins, and bismaleimide triazine resins are preferable.

The imprinting, ink jet printing and lithographic processes are included in conventional printing processes. They have the following features when used in forming a patterned coating of polysilane on a substrate surface.

The imprinting process involves immersing a rubber plate having a pattern of raised portions in a polysilane composition, and pressing the rubber plate against a substrate for thereby transferring the silicon components (polysilane and CF silane) on the raised portions to the substrate. Although the number of printable members is small, the imprinting process is advantageous in that a metal pattern can be formed even on a curved surface.

The ink jet printing process is by ejecting toward a substrate droplets of the polysilane composition having a size of a picoliter order through nozzle orifices in accordance with record signals to form a pattern. This process is advantageous in forming a micropattern.

The lithographic process uses a lithographic plate having image areas and non-image areas arranged on a support in a planar fashion. When the polysilane composition is supplied to the surface of the plate, the silicon components (polysilane and CF silane) adhere to only the lipophilic image areas. This process is advantageous in operation, economy and the number of printable members.

After a pattern of silicon components (polysilane and CF silane) is formed on a substrate by any of the above-described processes, the pattern is preferably dried by allowing the substrate to stand for some time in a dry atmosphere or keeping the substrate in vacuum at a temperature of about 40 to 150° C. The polysilane composition used preferably has a concentration of 0.1 to 50% by weight whereby a pattern of silicon components (polysilane and CF silane) is formed to a thickness of 0.01 to 100 $\mu$m.

Next, the substrate having a pattern of silicon components formed thereon is immersed in a solution of a catalytic metal salt such as a palladium or silver salt and then in an electroless plating solution.

The palladium salt used herein contains $Pd^{2+}$ and is generally represented by $Pd$—$Z_2$ wherein Z is a halogen such as Cl, Br or I, acetate, trifluoroacetate, acetylacetonate, carbonate, perchlorate, nitrate, sulfate or oxide. Preferred exemplary palladium salts are $PdCl_2$, $PdBr_2$, $PdI_2$, $Pd(OCOCH_3)_2$, $Pd(OCOCF_3)_2$, $PdSO_4$, $Pd(NO_3)_2$, and $PdO$. A halide such as hydrochloric acid or sodium chloride may be added to the palladium salt solution in order to enhance the stability thereof.

For the solution, there is used a solvent in which the palladium salt is highly soluble and which does not dissolve or attack the pattern of silicon components. Exemplary solvents include water, ketones such as acetone and methyl ethyl ketone, esters such as ethyl acetate, alcohols such as methanol and ethanol, and aprotic polar solvents such as dimethylformamide, dimethyl sulfoxide and hexamethylphosphoric triamide, as well as nitromethane and acetonitrile. Among others, water is most preferable.

The substrate is immersed in the palladium salt solution for about 1 second to about 10 minutes, washed with water and dried. There is obtained the substrate on which the palladium salt has been reduced into palladium particles on the polysilane pattern surface. If desired, the substrate is heat treated at 40 to 200° C. for promoting the reduction into palladium on the polysilane surface. Drying is generally effected at 10 to 200° C. under atmospheric pressure or vacuum.

Next, the structure is immersed in an electroless plating solution, from which a metal film deposits while palladium serves as the catalyst.

The electroless or chemical plating solution used herein is preferably a solution containing a metal ion such as copper, nickel, palladium, gold, platinum or rhodium. The electroless plating solution is generally prepared by formulating in water a water-soluble metal salt, a reducing agent (e.g., sodium hypophosphite, hydrazine, sodium boron hydride or dimethylaminoboran), and a complexing agent (e.g., sodium acetate, phenylenediamine or sodium potassium tartrate). Suitable electroless plating solutions are commercially available at reasonable costs.

Appropriate contact conditions with the electroless plating solution include a temperature of 15 to 120° C., especially 25 to 85° C. and a time of 1 minute to 16 hours, especially 10 to 60 minutes. It is practical to deposit a metal film to a thickness of 0.01 to 100 $\mu$m, especially 0.1 to 20 $\mu$m although the thickness varies with a particular purpose.

After the electroless plating, the structure is heated for improving the adhesion between the metal and the substrate, if desired. For example, the substrate is heated in an inert atmosphere such as argon or in vacuum, at a temperature of 60 to 300° C. for about 1 minutes to about 24 hours. Then the metal film resulting from electroless plating has a higher conductivity and hardness and better adhesion to the substrate.

Accordingly, the invention is successful in forming an adherent metal pattern by way of an imprinting, ink jet printing or lithographic process which is a simple inexpensive process eliminating a need for exposure and development steps. The metal pattern forming method of the invention can form on any type of substrate a metal pattern having improved adhesion between the metal and the substrate by a simple inexpensive process. Since the metal patterns can find use as printed circuit boards, flexible switches, battery electrodes, solar batteries, sensors, antistatic protective films, electromagnetic shield casings, integrated circuits, motor casings, and flat display panels, the inventive method is useful in the electric, electronic and communication fields.

Next, the method for preparing a wiring board according to the third and fourth embodiments of the invention is described.

The method according to the third embodiment is to prepare a wiring board through the following successive steps (1) to (3). There is obtained a printed wiring board having a fine metal pattern featuring improved adhesion between the substrate resin and the metal.

The method according to the third embodiment includes the steps of:

(1) forming a CF-silane containing polysilane thin film on a substrate and contacting a palladium salt with a surface of the polysilane thin film to form a palladium colloid layer thereon, (2) forming a photosensitive resin layer on the polysilane thin film having the palladium colloid layer, selectively irradiating light to the layer, and developing the layer, to thereby form a predetermined pattern of channels in the photosensitive resin layer so that the polysilane thin film having the palladium colloid layer is exposed within the channels, and (3) contacting an electroless plating solution with the polysilane thin film having the palladium colloid layer exposed within the channels, for thereby forming a conductive metal layer within the channels.

Referring to FIG. 1, step (1) includes forming a CF-silane containing polysilane thin film 2 on a substrate 1 and contacting a palladium salt with a surface of the polysilane thin film 2 to form a palladium colloid layer 3 thereon.

The polysilane and CF silane used in forming the CF-silane containing polysilane thin film on the substrate are preferably those of formulae (1) and (3) defined above, respectively.

The substrate on which the CF-silane containing polysilane thin film is to be formed may be made of insulating materials such as quartz glass, ceramics, plastics, and resins, semiconductors such as silicon, and conductors such as copper. Among these, resins or plastics such as phenolic resins, polyester resins, epoxy resins, polyimide resins, and bismaleimide triazine resins are preferable.

In forming the CF-silane containing polysilane thin film, any desired technique may be used, for example, conventional polysilane thin film forming techniques such as spin coating, dipping, casting, vacuum evaporation and Langmuir-Blodgett (LB) techniques. Preferred is the spin coating technique including mixing a polysilane with a CF silane, dissolving them in a suitable solvent, and applying the solution to the substrate while rotating the substrate at a high speed.

In connection with the spin coating technique used in forming the CF-silane containing polysilane thin film, the solvent in which the polysilane and CF silane are dissolved may be selected from aromatic hydrocarbon solvents such as benzene, toluene and xylene, and ether solvents such as tetrahydrofuran and dibutyl ether. The solvent is preferably used in such amounts that the solution may have a polysilane plus CF silane concentration of 1 to 20% by weight. After the CF-silane containing polysilane thin film is formed, it is preferably dried by allowing it to stand for some time in a dry atmosphere or keeping it at about 40 to 60° C. in vacuum. In step (1), the CF-silane containing polysilane thin film formed on the substrate preferably has a thickness of 0.01 to 100 μm, especially 0.1 to 10 μm.

Since the thin film formed on the substrate contains the polysilane and CF silane as main components, the film not only has a high strength, but also readily captures a palladium salt when the palladium salt is brought into contact therewith. Thus a palladium colloid layer is readily formed on the polysilane thin film. This, in turn, enables that a conductive metal layer (e.g., of copper) having improved adhesion to the substrate is formed by electroless plating.

Next, the CF-silane containing polysilane thin film formed on the substrate is contacted with a palladium salt. Contact is preferably effected by treating the substrate with a solution containing a palladium salt. The palladium salt used herein contains $Pd^{2+}$ and is generally represented by $Pd-Z_2$ wherein Z is a halogen such as Cl, Br or I, acetate, trifluoroacetate, acetylacetonate, carbonate, perchlorate, nitrate, sulfate or oxide. Preferred exemplary palladium salts are $PdCl_2$, $PdBr_2$, $PdI_2$, $Pd(OCOCH_3)_2$, $Pd(OCOCF_3)_2$, $PdSO_4$, $Pd(NO_3)_2$, and $PdO$.

For contacting the thin film with the palladium salt, a solution technique is preferably employed. The solution technique includes dissolving or dispersing the palladium salt in a suitable solvent and immersing in the solution or dispersion the substrate having the CF-silane containing polysilane thin film formed thereon.

In the solution technique, there is used a solvent in which the palladium salt is highly soluble and which does not dissolve the CF-silane containing polysilane thin film. Exemplary solvents include water, ketones such as acetone and methyl ethyl ketone, esters such as ethyl acetate, alcohols such as methanol and ethanol, and aprotic polar solvents such as dimethylformamide, dimethyl sulfoxide and hexamethylphosphoric triamide, as well as nitromethane and acetonitrile. Among others, water and alcohols such as ethanol are most preferable. A halide such as hydrochloric acid or sodium chloride may be added to the palladium salt solution in order to enhance the stability thereof.

The CF-silane containing polysilane thin film is preferably immersed in the palladium salt solution or dispersion for about 1 second to about 10 minutes. The immersion is preferably followed by drying. Then, the palladium salt is reduced into palladium particles on the surface of the CF-silane containing polysilane thin film. There is obtained the substrate having a palladium colloid layer formed thereon. After the contact with the palladium salt, if desired, the substrate Is heat treated at 40 to 200° C. for promoting the reduction of the palladium salt into palladium on the CF-silane containing polysilane thin film surface. Drying is generally effected at 10 to 200° C. under atmospheric pressure or vacuum.

In the subsequent step (2), a photosensitive resin layer 4 is formed on the palladium colloid layer 3. The photosensitive resin layer 4 is selectively irradiated with light and developed to form a predetermined pattern of channels 5 (only one channel is shown) in the photosensitive resin layer 4. The polysilane thin film 2 having the palladium colloid layer 3 is exposed within the channel 5, forming a pattern latent image.

For the photosensitive resin layer, either a positive resist or a negative resist may be used. In general, using a variety of existing photosensitive resins such as novolac-photoacid generator systems, chemically amplified silicon polymer systems, and polysilane systems which are known as positive working resist material, a layer may be formed in a conventional manner. The invention favors the use of polysilane resist materials, but not limited thereto.

In step (2), a photomask 6 of a predetermined pattern is positioned over the photosensitive resin layer 4 on the substrate 1. UV or visible light is irradiated from a suitable light source to the photosensitive resin layer 4 through the mask 6. Then, in the case of positive resist, only the exposed area of the photosensitive resin layer is converted to be soluble in a suitable solvent whereupon development is effected with the solvent to form the predetermined pattern of channels 5. The CF-silane containing polysilane thin film 2, specifically the palladium colloid layer 3, becomes exposed in the channels 5. The thickness of the photosensitive resin layer is desirably approximate to that of a metal thin film to be formed, typically 0.1 to 10 $\mu$m. Since the CF-silane containing polysilane film absorbs light or UV radiation and provides anti-reflection effect in the exposure step, the pattern shape is well retained.

The light source used herein may be a UV light source or visible light source. Illustrative examples are continuous spectrum light sources such as hydrogen discharge lamps, rare gas discharge lamps, tungsten lamps, and halogen lamps, lasers such as KrF and ArF lasers, and discontinuous spectrum light sources such as mercury lamps. A choice of the light source depends on the type of photosensitive resin. Mercury lamps having a radiation source of 248 to 254 nm in wavelength are preferable because of low costs and ease of handling. The light source preferably has a light quantity of 0.01 to 10 mJ/cm$^2$, especially 0.1 to 1 mJ/cm$^2$, per photosensitive resin layer thickness of 0.1 $\mu$m. If the light quantity is below the range, the underlying CF-silane containing polysilane thin film would be insufficiently exposed. A light quantity above the range would cause the CF-silane containing polysilane to be converted into a siloxane having no palladium reducing capability. These situations are detrimental to the subsequent formation of a satisfactory metal pattern.

After the light exposure, development is carried out. That is, the exposed area (in the case of positive resist) or unexposed area (in the case of negative resist) is removed using a developer. The developer used herein is a solution which can dissolve away only the exposed area (in the case of positive resist) or unexposed area (in the case of negative resist). It may be either an organic solvent or an aqueous base solution. By this development, the predetermined pattern of channels 5 is formed in the photosensitive resin layer 4. The CF-silane containing polysilane thin film 2 having the palladium colloid layer 3 is exposed within the channel 5.

In step (3), an electroless plating solution is contacted with the CF-silane containing polysilane thin film 2 having the palladium colloid layer 3 within the channel 5 to deposit a conductive metal layer 7 within the channel 5.

The electroless plating solution used herein is as previously described. Appropriate contact conditions with the electroless plating solution include a temperature of 15 to 120° C., especially 25 to 85° C. and a time of 1 minute to 16 hours, especially 10 to 60 minutes. It is practical to deposit a metal film to a thickness of 0.01 to 100 $\mu$m, especially 0.1 to 20 $\mu$m although the thickness varies with a particular purpose.

After step (3), the following step is carried out if desired. The structure resulting from step (3) is treated with a solvent for removing the photosensitive resin layer, or heated for further improving the adhesion between the metal and the substrate. If the photosensitive resin layer is formed of a polysilane base material, heat treatment is carried out at high temperatures to convert all polymer layers into ceramic or insulating layers and further stabilize the conductive metal layer formed by electroless plating. As a result, a wiring board having a more adherent metal pattern is obtained. For example, by the heat treatment at high temperatures of the structure resulting from step (3), all the polymer layers are converted into insulating layers consisting of ceramic material and the conductive metal layer resulting from electroless plating is stabilized. The heat treatment is generally effected at a temperature of about 200 to 1,200° C. for about 1 minute to about 24 hours and desirably, at about 300 to 900° C. for about ½ to 4 hours. Through the high-temperature treatment, the metal layer resulting from electroless plating acquires a higher conductivity and hardness and the ceramic converted from the polysilane possesses a higher heat resistance, insulating property and adhesion.

It is noted that by the high-temperature treatment of polysilane, Si-to-Si bonds are severed allowing various elements to be incorporated therein so that the material is stabilized. That is, the high-temperature treatment leads to the formation of a silicon oxide base ceramic material if the treatment is effected in an oxidizing atmosphere, typically air, a silicon nitride base ceramic material if effected in a reducing atmosphere, typically ammonia gas, or a silicon carbide base ceramic material if effected in an inert atmosphere, typically argon or in vacuum.

The method according to the fourth embodiment includes the steps of:

(I) forming a thin film of a polysilane with SiH group on a substrate and irradiating light to the thin film for crosslinking the polysilane for thereby insolubilizing the polysilane, (II) forming a photosensitive resin layer on the crosslinked polysilane thin film, selectively irradiating light to the layer, and developing the layer, to thereby form a predetermined pattern of channels in the photosensitive resin layer so that the crosslinked polysilane thin film is exposed within the channels, and (III) contacting a palladium salt with the crosslinked polysilane thin film exposed within the channels to form a palladium colloid layer and contacting an electroless plating solution for thereby forming a conductive metal layer within the channels. There is obtained a printed wiring board having a metal pattern featuring a high degree of definition.

Referring to FIG. 2, step (I) includes forming a SiH group-containing polysilane thin film 8 on a substrate 1. The polysilane thin film formed on the substrate is preferably formed of a material primarily comprising a polysilane of the following general formula (2).

$$(H_m R^2{}_n X_p Si)_q \qquad (2)$$

wherein $R^2$ is hydrogen or a substituted or unsubstituted monovalent aliphatic, alicyclic or aromatic hydrocarbon group, X is as defined for $R^2$ or an alkoxy group or halogen atom, m is a number of 0.1 to 2, n is a number of 0 to 1, p is a number of 0 to 0.5, the sum of m+n+p is from 1 to 2.5, and q is an integer of 4 to 100,000. Illustrative examples of the groups represented by $R^2$ and X and the preferred ranges of m, n, p and q are as described above for formula (1).

It is known from Fukushima et al., Chem. Lett., 1998, 347 that upon exposure to light, typically UV radiation, a polysilane having SiH bonds in a molecule represented by formula (2) undergoes crosslinking reaction and turns to be insoluble in solvents. In the method of the fourth embodiment of the invention, a polysilane having SiH bonds in a molecule undergoes crosslinking reaction and becomes insolubilized upon exposure to UV, and this polymer even after crosslinking by light exposure is effective for readily reduce a palladium salt to form a palladium colloid, which enables formation of a metal film (e.g., of copper) by electroless plating.

The substrate, the method of forming a polysilane film, the solvent in which polysilane is soluble, and the forming conditions are the same as in the third embodiment. The polysilane thin film formed on the substrate preferably has a thickness of 0.01 to 100 $\mu$m, especially 0.1 to 10 $\mu$m.

Then, the polysilane thin film 8 on the substrate 1 is irradiated with light (shown by arrows) whereby the polysilane is crosslinked for insolubilization, resulting in a crosslinked polysilane thin film 8'.

The light source used herein preferably emits light having a wavelength of at least 300 nm and may be a UV light source or visible light source. Illustrative examples are continuous spectrum light sources such as hydrogen discharge lamps, rare gas discharge lamps, tungsten lamps, and halogen lamps, lasers, and discontinuous spectrum light sources such as mercury lamps. Mercury lamps are preferable because of low costs and ease of handling. The light source preferably has a light quantity of 0.001 to 100 $J/cm^2$, especially 0.1 to 1 $J/cm^2$, per polysilane film thickness of 1 $\mu$m. A light quantity below the range would result in short crosslinking whereas a light quantity above the range would be detrimental to the subsequent formation of a palladium colloid in step (III).

Step (II) includes forming a photosensitive resin layer 4 on the crosslinked polysilane thin film 8' on the substrate, selectively irradiating light to the layer, and developing the layer, to thereby form a predetermined pattern of channels in the photosensitive resin layer 4 so that the crosslinked polysilane thin film 8' is exposed within the channel 5. The photosensitive resin layer may be formed as in the third embodiment and patterned using a patterned photomask 6 as in the third embodiment.

Similarly, development is effected as in the third embodiment.

The thickness of the photosensitive resin layer is desirably approximate to that of a metal thin film to be formed, typically 0.1 to 10 $\mu$m. Since the polysilane film absorbs UV radiation and provides anti-reflection effect in the exposure step, the pattern shape is well retained.

The light source used herein is preferably a laser such as KrF or ArF laser or a mercury lamp having a radiation source of 248 to 254 nm in wavelength. A stepper or scanner type exposure equipment having such a light source incorporated therein is preferably used. For the photomask, masks of the Levenson or halftone type based on the phase-shift mask technology may be used.

Step (III) includes contacting a palladium salt with the grooved photosensitive resin layer-bearing substrate to form a palladium colloid layer 9 on the crosslinked polysilane thin film 8' exposed within the channel 5, removing the unnecessary palladium salt, and contacting an electroless plating solution with the palladium colloid layer-bearing crosslinked polysilane film 8' for thereby forming a conductive metal layer 7 on the crosslinked polysilane film 8' within the channel 5.

More specifically, step (III) includes:
- step (III-1) of contacting a palladium salt with the structure resulting from step (II) to form a palladium colloid layer 9 at least on the crosslinked polysilane thin film 8' exposed within the channel 5 in the photosensitive resin layer 4,
- step (III-2) of washing the structure resulting from step (III-1) to remove an unnecessary palladium salt layer 10, and
- step (III-3) of contacting an electroless plating solution with the structure resulting from step (III-2) to form a conductive metal layer 7 on the crosslinked polysilane film 8' and the palladium colloid layer 9 within the channel 5.

First described is step (III-1). For contacting the thin film with the palladium salt, a technique as used in the third embodiment may be used while the palladium salt and its solution used may also be the same as in the third embodiment. Similarly, the palladium salt is contacted with the polysilane film using a solvent which does not dissolve the polysilane film, but in which the palladium salt is dissolved or dispersed, thereby forming a palladium colloid layer. In such a solution technique, a solvent which fully dissolves the palladium salt, but does not attack the pattern of polysilane is advantageously used. The solvent may be selected from the solvents exemplified in the solution technique of the third embodiment as the solvent for dissolving the palladium salt although a choice of the solvent depends on the solubility therein of a particular photosensitive resin used. Of these solvents, alcohols such as ethanol are favorable when phenylmethylpolysilane is used as the photosensitive resin.

The palladium salt is dissolved or dispersed in such a solvent. The structure having the pattern of channels formed subsequent to exposure is immersed in the solution or dispersion for about 1 second to 10 minutes, followed by drying. On the exposed area of the polysilane thin film within the patterned channel, which is hydrophilic, the palladium salt is reduced into palladium particles. On the unexposed area of the photosensitive resin layer, no palladium particles are formed. That is, an (unnecessary) palladium salt layer 10 is left on the photosensitive resin layer 4. In this way, the desirably patterned polysilane film-bearing substrate is obtained. Furthermore, if desired, the resulting structure is heat treated at a temperature of about 40 to 200° C. for promoting the reduction of the palladium salt into palladium on the polysilane thin film. Drying is desirably effected at a temperature of 10 to 200° C. under atmospheric pressure or in vacuum.

In step (III-2), the structure resulting from step (III-1) is washed to remove the unnecessary palladium salt layer 10. To this end, the structure is immersed in the solvent which can dissolve the palladium salt. Alternatively, the surface of the structure is scraped off by mechanical grinding. The unnecessary palladium salt layer 10 left on the photosensitive resin layer 4 is readily removed in this way. Whether the removal step is by dissolution or mechanical grinding, the palladium colloid layer within the channel is left intact after the removal step because palladium has been changed from ion to colloid.

In step (III-3), the structure resulting from step (III-2) is contacted with an electroless plating solution whereby a conductive metal layer 7 deposits on the crosslinked polysilane film 8' and specifically the palladium colloid layer 9 within the channel 5. The type of electroless plating solution and the plating conditions are the same as in the third embodiment.

After step (III), the structure may be treated as in the third embodiment. There is obtained a wiring board having a metal pattern featuring a high degree of definition.

The wiring board preparing method of the invention can form a metal wiring pattern having improved heat resistance and a high degree of definition by a simple inexpensive process. Specifically, the wiring board preparing method according to the third embodiment of the invention can form on any type of resin substrate a metal wiring pattern having improved adhesion between the metal and the substrate and a high degree of definition. The wiring board preparing method according to the fourth embodiment of the invention can form a conductive metal layer having improved adhesion between the metal and the substrate in a pattern having a high degree of definition. There is obtained a board having a high definition metal circuit formed thereon which is applicable to logic circuits and memory devices. Since the conductive wiring patterns can find use as printed circuit boards, various devices, flexible switches, battery electrodes, solar batteries, sensors, antistatic protective films, electromagnetic shield casings, integrated circuits, and motor casings, the wiring board preparing method is useful in the electric, electronic and communication fields.

EXAMPLE

Examples of the invention are given below by way of illustration and not by way of limitation. All parts are by weight.

Synthetic Example 1

Synthesis of phenylhydrogenpolysilane (PPHS)

To a flask purged with argon, a diethyl ether solution of bis(cyclopentadienyl)dichlorozirconium was added, whereby bis(cyclopentadienyl)dimethylzirconium serving as a catalyst was prepared in the system. Per mol of this bis(cyclopentadienyl)dimethylzirconium, 50 mol of phenylsilane was added. The mixture was heated and stirred at 100° C. for 24 hours. A molecular sieve was added to the reaction solution, which was filtered to remove the catalyst. Phenylhydrogenpolysilane having a weight average molecular weight of 2,600 was obtained as solids in a substantially quantitative manner.

Synthetic Example 2

Synthesis of phenylmethylpolysilane (PMPS)

In a nitrogen stream, 5.06 g (220 mmol) of metallic sodium was added to 60 ml of toluene. While heating at 110° C., the mixture was agitated at a high speed for dispersion. To the dispersion, 19.1 g (100 mmol) of phenylmethyldichlorosilane was slowly added dropwise with stirring. Agitation was continued for 4 hours until the reactant disappeared, completing the reaction. After the reaction solution was allowed to cool down, the salt was filtered off, and the residue was concentrated, obtaining 10.0 g (crude yield 83%) of a polysilane crude product. This polymer was dissolved in 30 ml of toluene again and 120 ml of hexane was added whereupon the polymer precipitated and separated. There was obtained 6.6 g (yield 55%) of phenylmethylpolysilane having a weight average molecular weight of 45,000.

Example 1 and Comparative Example 1

In 9.2 g of toluene were dissolved 0.8 g of the polysilane (phenylhydrogenpolysilane, abbreviated as PPHS) synthesized in Synthetic Example 1 and 8 mg of N-β-(aminoethyl)-γ-aminopropyltrimethoxysilane as a CF-silane (corresponding to 1 part of the CF-silane per 100 parts by weight of the polysilane). This polysilane composition was applied onto a glass fiber-filled epoxy resin substrate by an imprinting, ink jet printing or lithographic process to form a pattern of silane components, which was dried at 50° C. and 2 mmHg. This is Step 1.

Next, the above substrate was immersed for one minute in a 3% aqueous solution of palladium chloride and washed with water. The treated substrate was then immersed in an electroless plating solution, which contained 20 g of nickel sulfate, 20 g of sodium hypophosphite and 30 g of sodium acetate in 1,000 g of water, at 80° C. for 10 minutes whereby a nickel metal pattern was formed. The substrate was washed with pure water, dried at 60° C. for 5 minutes, and heat treated in nitrogen at 150° C. for ½ hour. There was obtained a glass fiber-filled epoxy resin substrate having a nickel pattern formed thereon. This is Step 2.

The nickel section of the structure had a conductivity of $1 \times 10^4$ S/cm and the substrate section had a conductivity of $1 \times 10^{-9}$ S/cm. The nickel pattern had a fineness of 100 μm when the imprinting process was used, 10 μm when the ink jet printing process was used, and 20 μm when the lithography was used. The adhesion between the nickel film and the substrate was examined using an adhesive tape, finding no peeling.

In Comparative Example 1, the same procedure as above was repeated except that the CF silane was omitted. In the adhesive tape test, partial peeling of the nickel film from the substrate was found. Also, the same procedure as above was repeated except that the polysilane was omitted. Little nickel deposited on the substrate.

Examples 2–6

The polysilane (PPHS) synthesized in Synthetic Example 1, 0.8 g, and a CF-silane, the type and amount of which are shown in Table 1, were dissolved in 9.2 g of toluene to give a 8% solution. This CF-silane containing polysilane composition was applied onto a glass fiber-filled epoxy resin substrate by spin coating at 3,000 rpm for 10 seconds and dried at 50° C. and 2 mmHg, forming a thin film of 0.3 μm thick. The epoxy resin substrate having the polysilane thin film formed thereon was immersed for one minute in a 3% ethanol solution of palladium chloride and then dried for 30 minutes at 350° C. This is Step 1.

The polysilane (phenylmethylpolysilane, abbreviated as PMPS) synthesized in Synthetic Example 2 was used as a photosensitive resin. The PMPS was dissolved in toluene to form a 5% solution. This polysilane solution was applied onto the quartz glass plate having the CF-silane containing PPHS film formed thereon in Step 1, by spin coating at 2,000 rpm for 5 seconds. Drying at 50° C. and 2 mmHg gave a photosensitive resin layer. The resulting structure was a substrate on which a pattern was to be formed. The thickness of the CF-silane containing PPHS film and the photosensitive resin layer combined was 0.6 μm. A photomask was positioned over the substrate, which was exposed, using a 20-W low-pressure mercury lamp, to UV radiation of 254 nm in a light quantity of 10 J/cm². By development with ethanol, the exposed area was removed. This is Step 2.

The structure resulting from Step 2 was then immersed in an electroless plating solution, which contained 20 g of nickel sulfate, 10 g of sodium hypophosphite and 30 g of sodium acetate in 1,000 g of water, at 50° C. for 30 minutes whereby a nickel metal circuit was formed. This is Step 3.

The structure was washed with pure water, dried at 60° C. for 5 minutes, and heat treated in nitrogen at 150° C. for ½ hour. There was obtained a glass fiber-filled epoxy resin substrate having a nickel pattern formed thereon.

The nickel section of the structure had a conductivity of $1 \times 10^4$ S/cm and the unexposed section had a conductivity of $1 \times 10^{-12}$ S/cm.

The adhesion between the nickel film and the substrate was examined by the adhesive tape test, with the results being shown in Table 1.

Comparative Example 2

The same procedure as above was repeated except that in Step 1, the polysilane film was formed using a CF silane-free polysilane. There was obtained a glass fiber-filled epoxy resin substrate having a nickel pattern formed thereon.

The adhesion between the nickel film and the substrate was examined by the adhesive tape test, with the results being shown in Table 1.

TABLE 1

| | CF silane, blend amount mg, (pph*) | Adhesive tape test (% adhesion) |
|---|---|---|
| Example 2 | KBM-603 8 mg (1) | Excellent (100) |
| Example 3 | KBM-603 (10) | Excellent (95) |
| Example 4 | KBM-603 (50) | Good (60) |
| Example 5 | KBM-903 (1) | Excellent (100) |
| Example 6 | KBM-403 (1) | Good (70) |
| Comparative Example 2 | — | Poor (5) |

*parts by weight of CF silane per 100 parts by weight of polysilane

Example 7

The polysilane (PPHS) synthesized in Synthetic Example 1 was dissolved in toluene to give a 8% solution. The polysilane solution was applied onto a quartz glass plate by spin coating at 3,000 rpm for 10 seconds and dried at 50° C. and 2 mmHg, forming a thin film of 0.3 μm thick. The entire surface of the substrate was exposed to UV radiation in a light quantity of 100 mJ/cm² using a low-pressure mercury lamp of 20 W and an alkali glass filter of 0.1 mm thick for cutting UV radiation having a wavelength of shorter than 300 nm. By irradiation, the polysilane was crosslinked and insolubilized. This is Step I.

The polysilane (PMPS) synthesized in Synthetic Example 2 as a photosensitive resin was dissolved in toluene to form a 5% solution. This polysilane solution was applied onto the quartz glass plate having the crosslinked PPHS film formed thereon in Step 1, by spin coating at 3,000 rpm for 10 seconds. Drying at 50° C. and 2 mmHg gave a photosensitive resin layer. The resulting structure was a substrate on which a pattern was to be formed. The thickness of the crosslinked PPHS film and the photosensitive resin layer combined was 0.6 μm. A photomask was positioned over the structure, which was exposed, using a low-pressure mercury lamp of 20 W, to UV radiation of 254 nm in a light quantity of 5 J/cm². By development with ethanol, the exposed area of PMPS was removed. This is Step II.

The structure resulting from Step II was contacted with a 3% ethanol solution of palladium chloride (Step III-1). It was washed with ethanol. The surface of the PMPS layer was ground to remove the palladium on the surface (Step III-2). This structure was then immersed in an electroless copper plating solution at 25° C. for 15 minutes. The electroless plating solution was a 1:1 (by volume) mixture of a plating solution A containing 2.5 g of copper sulfate pentahydrate, 11.3 g of potassium sodium tartrate pentahydrate, and 2.8 g of potassium hydroxide in 83.4 g of water and a plating solution B containing 7 g of a 37% formalin aqueous solution in 93 g of water. This electroless plating formed a copper circuit having a high degree of pattern definition. This is Step III-3.

The structure was washed with pure water, dried at 60° C. for 5 minutes, and heat treated at 100° C. for one hour. There was obtained a quartz glass substrate having a conductive layer of copper formed within channels (wiring board). The copper circuit section on the quartz glass substrate was measured for conductivity and minimum line width. The conductivity was measured by a four-probe method on the copper film. The line width of the copper circuit was measured under a microscope. The results are given below.

Conductivity: 1×10⁴ S/cm
Minimum line width: 1 μm

It was confirmed that a metal pattern having a high degree of definition was obtained.

Comparative Example 3

A quartz glass substrate was processed as in Example 7 except that the step of light irradiation for crosslinking was omitted from Step I. On the resulting substrate, copper was present only at the boundary between the exposed and unexposed areas and no copper formed on the exposed and unexposed areas.

Comparative Example 4

A quartz glass substrate was processed as in Example 7 except that the step of light irradiation for crosslinking was omitted from Step I and the step of PMPS surface grinding was omitted from Step III-2. The copper circuit section on the quartz glass substrate was measured for conductivity and minimum line width by the same procedures as above. The results are given below.

Conductivity: 1×10⁴ S/cm
Minimum line width: 20 μm

Japanese Patent Application Nos. 10-300894 and 10-309793 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A method for preparing a wiring board comprising the steps of:
   (1) forming on a substrate a thin film of a polysilane composition comprising a polysilane and an amino group-containing alkoxysilane and contacting a palladium salt with a surface of the polysilane thin film to form a palladium colloid layer thereon,
   (2) forming a photosensitive resin layer on the polysilane thin film having the palladium colloid layer, selectively irradiating light to the layer, and developing the layer, to thereby form a predetermined pattern of channels in the photosensitive resin layer so that the polysilane thin film having the palladium colloid layer is exposed within the channels, and
   (3) contacting an electroless plating solution with the polysilane thin film having the palladium colloid layer exposed within the channels, for thereby forming a conductive metal layer within the channels.

2. The method of claim 1 wherein the polysilane is of the following formula (1):

$$(R^1{}_m R^2{}_n X_p Si)_q \tag{1}$$

wherein $R^1$ and $R^2$ each are hydrogen or a substituted or unsubstituted monovalent aliphatic, alicyclic or aromatic hydrocarbon group, X is hydrogen or a substituted or unsubstituted monovalent aliphatic, alicyclic or aromatic hydrocarbon group, alkoxy group or halogen atom, m is a number of 0.1 to 2, n is a number of 0 to 1, p is a number of 0 to 0.5, the sum of m+n+p is from 1 to 2.5, and q is an integer of 4 to 100,000.

3. A method for preparing a wiring board comprising the steps of:
   (I) forming a thin film of polysilane with SiH group on a substrate and irradiating light to the thin film for crosslinking the polysilane for thereby insolubilizing the polysilane, (II) forming a photosensitive resin layer on the crosslinked polysilane thin film, selectively irradiating light to the layer, and developing the layer, to thereby form a predetermined pattern of channels in the photosensitive resin layer so that the crosslinked polysilane thin film is exposed within the channels, and (III) contacting a palladium salt with the crosslinked polysilane thin film exposed within the channels to form a palladium colloid layer and contacting an electroless plating solution for thereby forming a conductive metal layer within the channels.

4. The method of claim 3 wherein the polysilane is of the following formula (2):

$$(H_m R^2_n X_p Si)_q \tag{2}$$

wherein $R^2$ is hydrogen or a substituted or unsubstituted monovalent aliphatic, alicyclic or aromatic hydrocarbon group, X is hydrogen or a substituted or unsubstituted monovalent aliphatic, alicyclic or aromatic hydrocarbon group, alkoxy group or halogen atom, m is a number of 0.1 to 2, n is a number of 0 to 1, p is a number of 0 to 0.5, the sum of m+n+p is from 1 to 2.5, and q is an integer of 4 to 100,000.

5. The method of claim 3 wherein in step (I), the polysilane thin film on the substrate is irradiated with light in an exposure of 0.001 to 100 J/cm².

6. The method of claim 3 wherein the electroless plating solution contains a copper or nickel ion.

* * * * *